(12) United States Patent
Lehr et al.

(10) Patent No.: US 6,363,044 B1
(45) Date of Patent: Mar. 26, 2002

(54) AUTOMATICALLY ADAPTING FORWARD OR REVERSED BIASED PHOTODIODE DETECTION CIRCUIT

(75) Inventors: Steffen Lehr; Christian Buechler; Friedheim Zucker, all of Villingen-Schwenningen (DE)

(73) Assignee: Deutsche Thomson-Brandt GmbH, Villingen-Schwenningen (DE)

( * ) Notice: Subject to any disclaimer, the term of this patent is extended or adjusted under 35 U.S.C. 154(b) by 0 days.

(21) Appl. No.: 09/209,716

(22) Filed: Dec. 11, 1998

(30) Foreign Application Priority Data

Dec. 29, 1997 (EP) .............................. 97403172

(51) Int. Cl.[7] .................................. G11B 3/90
(52) U.S. Cl. .................. 369/53.27; 369/53.22; 369/116
(58) Field of Search .............................. 369/116, 124.1, 369/53.26, 53.27, 53.22; 372/9; 324/768; 250/208.1, 367, 370.11, 578.1, 209

(56) References Cited

U.S. PATENT DOCUMENTS

| | | | |
|---|---|---|---|
| 4,656,350 A | * | 4/1987 | Faugeras et al. ............ 250/209 |
| 4,713,819 A | | 12/1987 | Yoshikawa ..................... 372/9 |
| 4,945,243 A | * | 7/1990 | Arques ........................ 250/367 |
| 5,355,082 A | | 10/1994 | Schreiber et al. ........... 324/768 |
| 5,912,578 A | * | 6/1999 | Bird ............................ 327/407 |

FOREIGN PATENT DOCUMENTS

| | | | |
|---|---|---|---|
| EP | 305 148 A1 | 3/1989 | ............ G01R/31/28 |
| EP | 782 251 A1 | 7/1997 | ............. H03F/3/08 |

* cited by examiner

*Primary Examiner*—David Hudspeth
*Assistant Examiner*—Kim-Kwok Chu
(74) *Attorney, Agent, or Firm*—Joseph S. Tripoli; Paul P. Kiel

(57) ABSTRACT

A photodiode detection circuit is used to automatically identify a type of photodiode circuit connected to it. The photodiode circuit comprises at least a photodiode. Once the type of photodiode circuit has been identified by applying a current to it and evaluating a voltage occuring at an input of the detection circuit the photodetection circuit adapts itself to it, e.g. a reverse biasing voltage is/isn't applied to the photodiode of the photodiode circuit. The result is a photodiode detection circuit which uses a forward or a reversed biased photodiode. The photodiode detection circuit is now in a state to measure light falling on the photodiode. The detection circuit may be part of a light intensity monitoring and controlling circuit which allows to regulate the intensity of a laser beam in an optical disk reading/recording device.

9 Claims, 5 Drawing Sheets

AUTOMATICALLY ADAPTING FORWARD OR REVERSED BIASED PHOTODIODE DETECTION CIRCUIT

BACKGROUND OF THE INVENTION

The present invention relates to a method and a circuit which allow to automatically obtain a forward or a reversed biased photodiode detection device. The invention may for example be used in optical disk players and/or recorders.

In many applications where light is used e.g. as a tool to work on material or as a means to scan information stored on an information medium, thus applications in which a light source is involved, it appears necessary to keep a light intensity constant at a predetermined level at some stage of a process. Typically the light intensity is measured using a photodetector, a result of this measurement is compared with a reference value and a power fed to the light source accordingly regulated.

For some applications it is common to use photodiodes to measure the light intensity, these being a kind of photodetector which in practice may be used in a photodiode circuit of a forward biased or a reversed biased type. The use of either a forward biased or a reversed biased photodiode circuit is typically subjected to an availability of either one type of photodiode circuit on the market. For reasons of flexibility to market conditions a light intensity measuring circuit using photodiodes should be able to use either one of the forward biased or reversed biased photodiode circuit.

A configuration known from prior art and shown in FIG. 1 is used to regulate a light intensity emitted by a light source 1. Either one of a reversed biased photodiode circuit 2 or a forward biased photodiode circuit 3 may be used to determine a light intensity emitted by the light source 1. Either one of photodiode circuits 2 or 3 is connected to an input 4 of a detection device 5 (shown by a dotted connection line). The detection device comprises switches 6 and 7 which may simultaneously be switched when an appropriate signal is applied to a switching control input 8. In case the forward biased photodiode circuit 3 is connected to the input 4 the switches 6 and 7 are switched to the state H and a photovoltage at input 4 is directly transmitted to power regulating means 9. The power regulating means 9 allow to compare the photovoltage to a reference photovoltage and accordingly regulate a power amplitude fed to the light source I in order to maintain a value of the photovoltage to a value of the referenced photovoltage. In an alternative case where the reversed biased photodiode circuit 2 is connected to the input 4 the switches 6 and 7 are switched to the position L. A photovoltage at the input 4 is inverted by the inverter 10 before being transmitted to the power regulating means 9.

A drawback of the known configuration in FIG. 1 is that when either photodiode circuit 2 or 3 is connected to the input 4 the appropriate signal has to be applied to the switching control input 8 by means of an external intervention on the switching control input 8 e.g. by soldering (or de-soldering) the switching control input 8 to (from) ground. The known configuration is typically realized as part of an integrated circuit and the switching control input 8 is one of many pins of this integrated circuit. Soldering the single switching control input pin of the integrated circuit to ground is a delicate manufacturing process which is subject to errors.

SUMMARY OF THE INVENTION

It is an object of the invention to find a solution for a detection method or circuit in which either one of a forward biased or a reversed biased photodiode circuit may be used but in which the need for an external intervention on the detection circuit to adapt the detection circuit to the type of photodiode circuit connected to it is eliminated.

A solution to the above described problem is according to the present invention found in a method for automatically identifying a first or a second type of photodiode circuit which each have a first and a second output (or "output terminal") and which comprises the steps of:

connecting the first output to ground, connecting to the second output a current source of a predetermined current value, comparing a voltage at the second output with a predetermined reference voltage, emitting a signal indicating a result of the comparing which allows an identification of either the first or the second type of photodiode circuit.

The steps of the method according to the invention may be performed automatically and identify a first or a second type of photodiode circuit, e.g. a forward biased or a reversed biased photodiode type circuit.

Another solution to the above described problem is according to the invention found in a method for automatically obtaining a forward or a reversed biased photodiode device which delivers between a first and a second electrode a photovoltage of a predetermined polarity, depending on either one of a first or a second type of photodiode circuit which each have a first and a second output. The method comprises the steps of:

connecting the first output to ground, connecting to the second output a current source of a predetermined current value, comparing a voltage at the second output with a predetermined reference voltage, emitting a signal indicating a result of the comparing which allows an identification of at least the second type of photodiode circuit, storing the signal, disconnecting the first output from ground and the second output from the current source, connecting the first and the second output to the first and second electrode respectively, maintaining the second output at a constant reverse biasing voltage if said stored signal identifies the second type of photodiode circuit by comparing a biasing voltage value at the second output with a reference biasing voltage value and accordingly to a result of this comparison applying a variable current to the first output.

Yet another solution to the above described problem is according to the present invention found in a method for controlling an intensity of a light source in which following steps are comprised:

connecting either one of a first or a second type of photodiode circuit to a detection circuit, adapting said detection circuit for the first or the second type of the photodiode circuit connected to it, receiving on at least a photodiode of the first or the second photodiode circuit light emitted by said light source, obtaining at an output of the detection circuit a photovoltage of a predetermined polarity, regulating an intensity of the light source such to maintain the photovoltage at a reference photovoltage value.

The method further comprises the steps of:

disconnecting the detection circuit from the first or the second type of photodiode circuit, connecting to the first or the second type of photodiode circuit a test circuit, determining at least whether the second type of photodiode circuit is connected to the test circuit, storing a positive value if the determining reveals the second type of photodiode circuit, disconnecting the test circuit, performing the adapting for said second type of photodiode circuit if the stored result is positive, or else for the first type of photodiode circuit.

Yet another solution to the above described problem is according to the present invention found in an automatically adapting forward or reversed biased photodiode detection circuit comprising a first and a second input for connecting a photodiode circuit, the first input being connected to ground over a first switch, the second input being connected over a second switch to a current source and over a third switch to voltage evaluating means. The detection circuit further comprises first switching for simultaneously opening or closing the first, second and third switches, regulating means having an input connected over a fourth switch to the second input and an output connected over a fifth switch to the first input to regulate a biasing voltage at the second input to a predetermined reverse biasing voltage. Furthermore, it comprises second switching means for simultaneously opening or closing the fourth and fifth switches, these being connected to an output of said voltage evaluating means and to the first switching means.

The detection circuit according to the invention is a simple way of realizing the method for automatically obtaining a forward or a reversed biased photodiode device.

In a preferred embodiment of the detection circuit the voltage evaluating means comprise a voltage source which generates a predetermined reference voltage, a voltage comparator one input of which is connected to the voltage source, another input of which is connected to the third switch, a memory device to store a result of a comparison delivered at an output of the voltage comparator.

In another preferred embodiment of the detection circuit the regulating means comprise a further voltage source which generates the predetermined reversed biasing voltage, an amplifier an input of which is connected to the further voltage source, another input of which is connected to the fourth switch, an output of which is connected to the fifth switch.

Yet another solution to the above described problem is according to the invention found in a light intensity monitoring and controlling circuit which comprises an automatically adapting forward and reversed biased photodiode detection circuit as described above, further voltage evaluating means to determine a photovoltage value of a voltage between the first and second input, the further evaluating means having a first and a second evaluating input connected to the first and the second input through a sixth and a seventh switch respectively, the photovoltage value being emitted at an evaluating output, third switching means which allow to simultaneously open or close the sixth and the seventh switch and an input of which is connected to the second switching means, power regulating means which allow to regulate an intensity of a light source as a function of the photovoltage value, the power regulating means being connected to the evaluating output.

In a preferred embodiment of the light intensity monitoring and controlling circuit the power regulating means comprise a reference voltage source which generates a predetermined reference voltage, photovoltage comparing means to compare said predetermined reference photovoltage with the photovoltage, a result of the photovoltage comparing being used to regulate the intensity.

The light intensity monitoring and controlling circuit allows a simple realization of the method for controlling an intensity of a light source according to the invention.

BRIEF DESCRIPTION OF THE DRAWINGS

In the following a detailed description of ways to carry out the invention will be given using examples and referring to FIGS. 1 to 11 wherein.

Throughout the description same references will be used to designate same objects.

DESCRIPTION OF THE PREFERRED EMBODIMENTS

Figure 1:
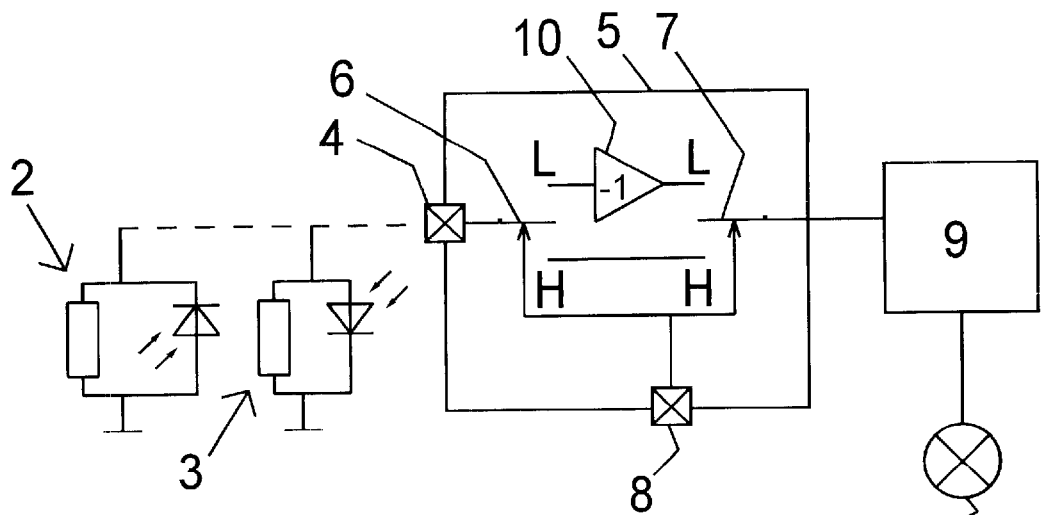
FIG. 1 shows a configuration used to regulate a light intensity as known from prior art, FIG. 2 contains a flowchart which illustrates a method for automatically identifying a first or a second type of photodiode circuit, FIG. 3 contains a flowchart illustrating a method for automatically obtaining a forward or a reversed biased photodiode circuit device, FIG. 4 contains a flowchart illustrating a method for controlling an intensity of a light source, FIG. 5 contains a schematical illustration of an automatically adapting forward or reversed biased photodiode detection circuit, FIG. 6 and FIG. 7 contain schematical illustrations of a first and a second photodiode circuit, FIG. 8 contains a schematical representation of voltage evaluating means, FIG. 9 contains a schematical representation of regulating means, FIG. 10 contains a schematical representation of a light intensity monitoring and controlling circuit, FIG. 11 contains a schematical representation of power regulating means.
Figure 2:
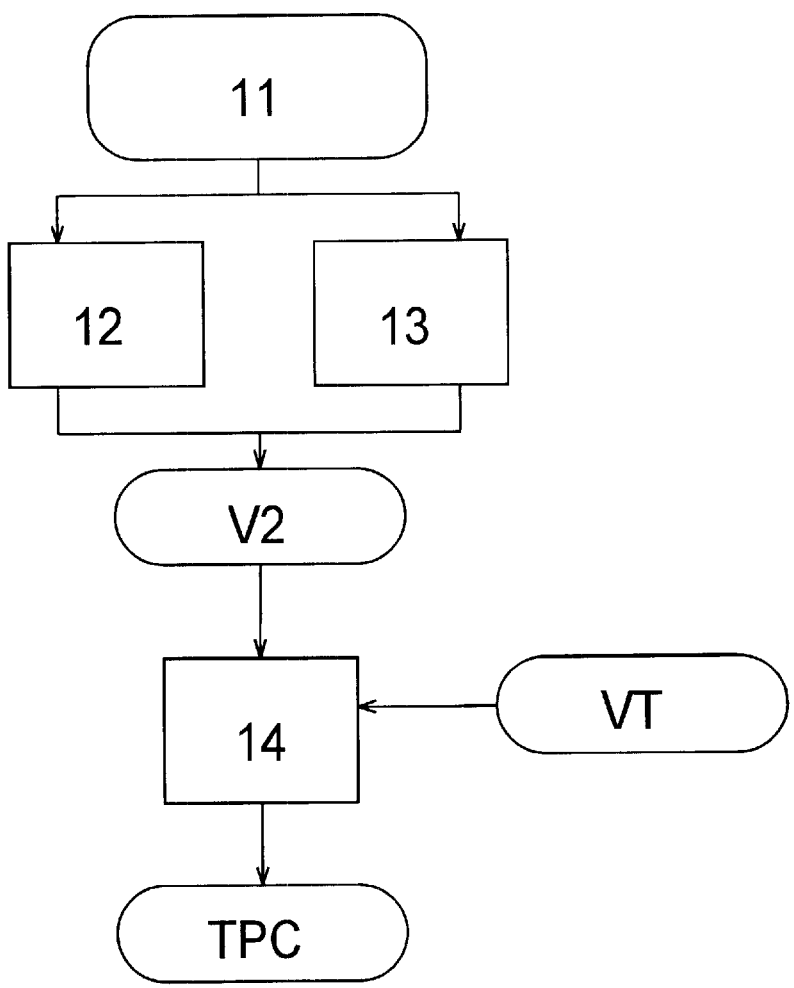

A flowchart in FIG. 2 shows that departing from a first or a second type of photodiode circuit in box 11 which each have a first output (or "output terminal") and a second output (or "output terminal"), the first output is connected in a step 12 to ground and the second output is connected in a step 13 to a current source of a predetermined current value. As a result, a voltage V2 is obtained at the second output. The voltage V2 is compared in a step 14 with a pre-determined reference voltage VT. Following step 14 a signal TPC which indicates a result of the comparing and allows an identification of either the first or the second type of photodiode circuit in box 11 is emitted. Hence the photodiode circuit from box 11 is tested and identified.

Figure 3:
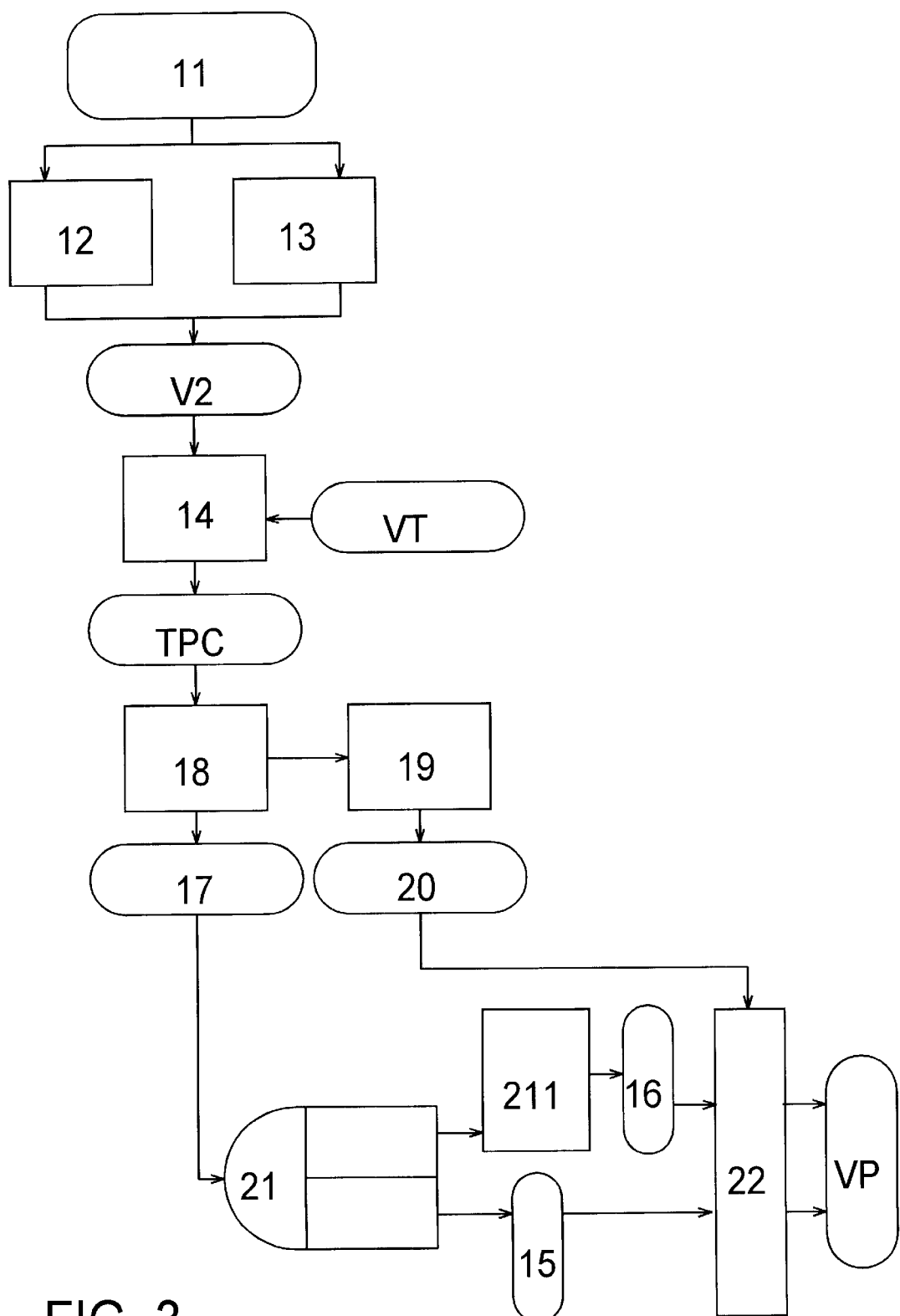

A flowchart in FIG. 3 illustrates a method which departing from a first or a second type of a photodiode circuit in box 11 allows to obtain a forward biased circuit in a box 15 or a reversed biased circuit in a box 16, either one of which delivers a photovoltage VP. In a similar way as described for the flowchart in FIG. 2 a signal TPC which allows an identification of either the first or the second type of photodiode circuit from box 11 is obtained through steps 12, 13 and 14. The signal TPC is stored in a memory 17 as a result of a storing step 18. In a step 19 the first output is disconnected from ground and the second output from the current source. Hence the disconnected first or second photodiode circuit in box 20 is in the same initial state as in box 11 but the signal stored in memory 17 indicates whether a first or a second photodiode is present. Subsequent to a case consideration 21, if the signal stored in memory 17 identifies a second type of photodiode circuit the second output is in a step 211 connected to a reverse biased voltage source and maintained at a constant reverse biased voltage VB. The reversed biased photodiode circuit 16 is obtained and the first and the second output of the photodiode circuit are connected in a step 22 to a first and a second electrode between which exists a photo voltage VP.

If in case consideration 21 the signal TPC stored in memory 17 does not identify the second type of photodiode circuit, a forward biased photodiode circuit 15 is obtained and the first and second output are connected in step 22 to the first and second electrode respectively.

Figure 4:
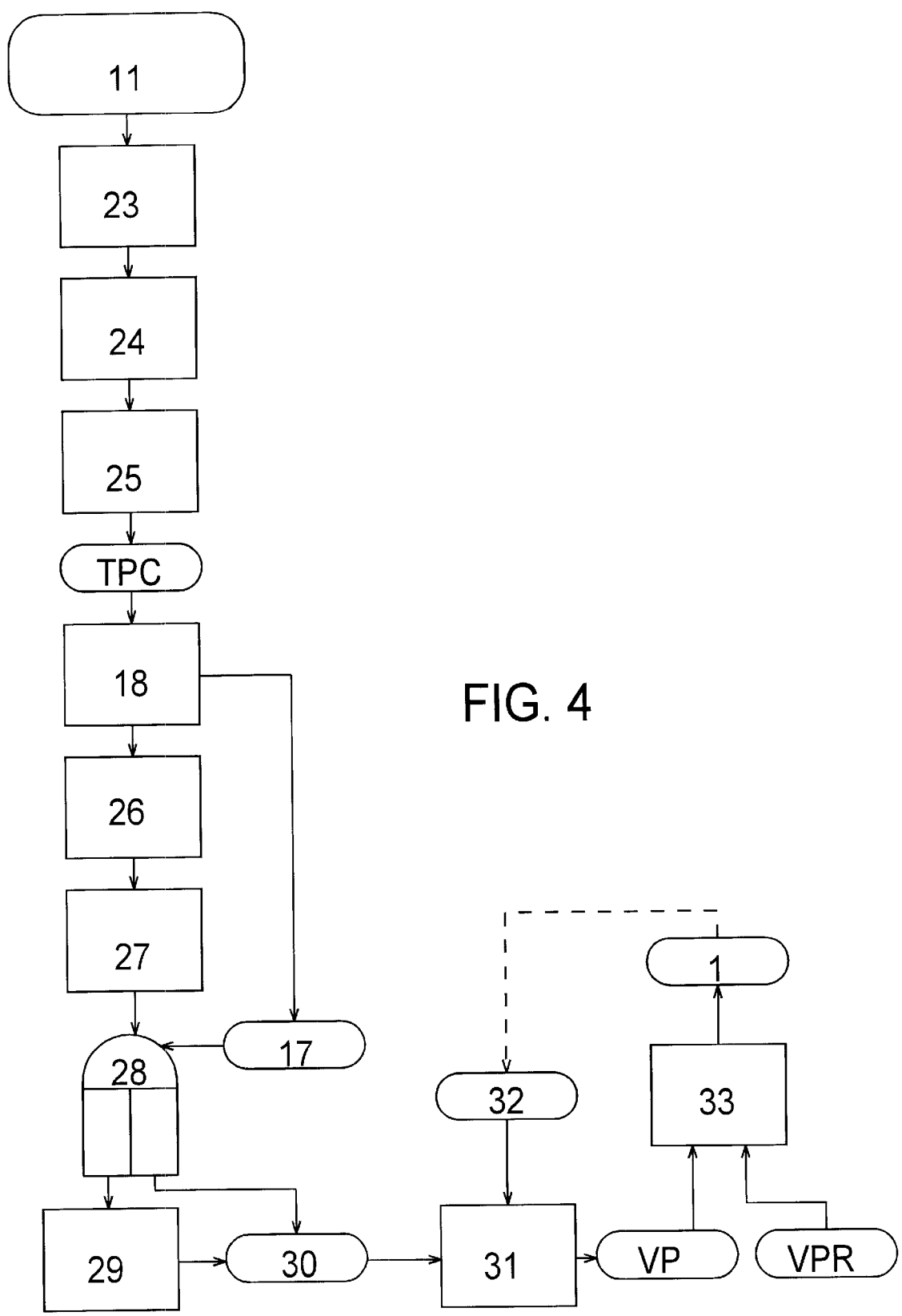

A flowchart in FIG. 4 illustrates how departing from either a first or a second type of a photodiode circuit in box 11 an intensity of the light source 1 may be controlled. At first in a step 23 the photodiode circuit is disconnected from any detection circuit which might be used to obtain the photo voltage VP using the photodiode circuit. In a step 24 the first or the second photodiode circuit from box 11 is connected to a test circuit which in a step 25 allows to determine the type of the photodiode circuit connected to the test circuit and accordingly to emit the signal TPC. The step 18 stores the signal TPC in the memory 17 and the identified photocircuit is disconnected from the test circuit in a step 26. The detection circuit disconnected in step 23 is reconnected to the photodiode circuit in step 27.

A case consideration 28 looks at the content of memory 17 and if the signal stored in memory 17 identifies the second type of photodiode circuit, the detection circuit is adapted in a step 29 to be used in combination with the second type of photodiode circuit. In the opposite case, the case consideration step 28 leaves the detection circuit unmodified. It is admitted that the detection circuit may be used with the first type of photodiode circuit without being adapted. The detection circuit in box 30 is now in a state to be used with the type of photodiode circuit connected to it.

In a detection step 31 light represented by a box 32 and originating from the light source 1 falls on at least a photodiode of the connected photodiode circuit and allows to obtain a photo voltage VP. In a step 33, the photo voltage VP is compared to a reference photo voltage VPR and the intensity of the light source 1 is regulated using a result of the comparison such as to maintain the photo voltage VP at a value of the reference photo voltage VPR.

Figure 5:
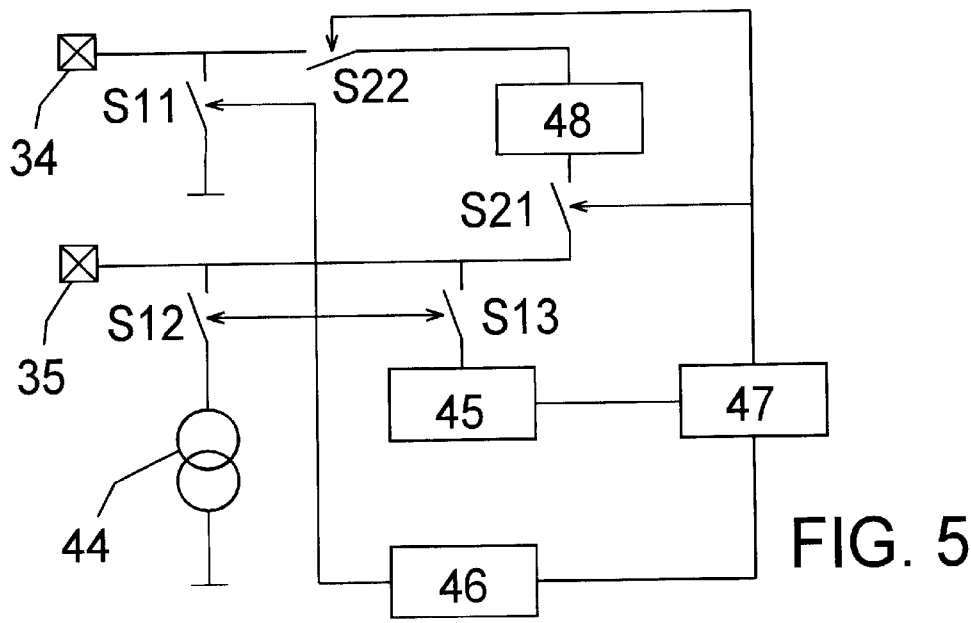

A detection circuit shown in FIG. 5 may automatically adapt itself to a type of photodiode circuit (not shown in FIG. 5) which is connected to the first input 34 and the second input 35, and as a result become a photodiode detection circuit using a forward or a reversed biased photodiode.

Figure 6:
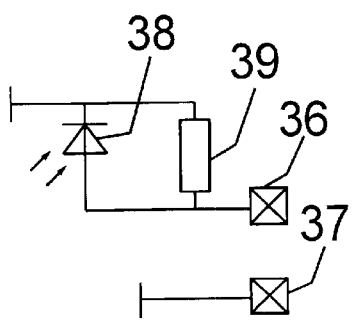

FIG. 6 shows an example for a photodiode circuit, a first output 36 and a second output 37 of which may be connected to the first and the second output 34 and 35 respectively of the circuit shown in FIG. 5. The photodiode circuit comprises a photodiode 38 which on one side is connected to the first output 36 and on the other side to ground. A resistor 39 is connected parallely to the photodiode 38. The second output 37 is connected to ground.

Figure 7:
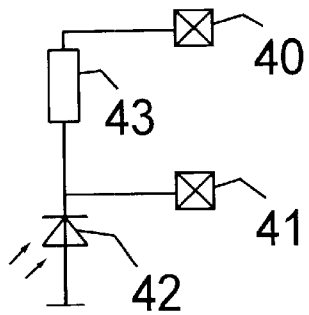

FIG. 7 shows another example of a photodiode circuit which through a first output 40 and a second output 41 may be connected to the first and the second input 34 and 35 respectively of the circuit shown in FIG. 5. The photodiode circuit comprises a photodiode 42 connected at one pole to ground and at an other pole to the second output 41. The first output 40 is connected to the second output 41 through a resistor 43.

Coming back to the detection circuit shown in FIG. 5 the first input 34 may be connected to ground through a switch S11. The second input 35 may through a switch S12 be connected to a current source 44 which delivers a current IT having a predetermined value. The second input 35 may also be connected to voltage evaluating means 45 through a switch S13. The switches S11, S12 and S13 may simultaneously be closed or opened by first switching means 46. An output of the voltage evaluating means 45 and an output of the first switching means 46 are connected to second switching means 47 which are used to simultaneously open or close switches S21 and S22. In a case where the switches S21 and S22 are closed a voltage at the second input 35 is fed to regulating means 48. The regulating means 48 apply a signal to the first input 34, which is a function of the signal received at an input of the regulating means 48 and is intended to regulate a value of the voltage at the second input 35.

As an example it will be described how the detection circuit from FIG. 5 works when the photodiode circuit shown in FIG. 6 is connected to it. At first switches S21 and S22 should be in an open state. This may for example be assured by the second switching means 47. Then the first switching means 46 simultaneously close the switches S11, S12 and S13. The current IT generated by the current source 44 flows directly to ground through the second output 37 of the photodiode circuit. As a result a voltage evaluated at an input of the voltage evaluating means 45 will reveal itself to be of a value near to zero since the current IT encounters virtually no resistance on its way to ground. The voltage evaluating means 45 having evaluated the voltage at its input, the switching means 46 simultaneously open the switches S11, S12 and S13. At the same time the first switching means 46 send a signal to the second switching means 47 indicating the open state of the switches S11, S12 and S13. The second switching means 47 receive a result of the evaluation performed by the voltage evaluating means 45 and as a result leave the switches S21 and S22 in an open state. The detection circuit is now adapted to be used with a forward biased photodiode. Light falling on the photodiode 38 generates a current between the first input 34 and ground which on turn generates a voltage at the poles of the resistor 39. The second input 35 being connected to ground through the second output 37, the voltage present between the first and the second input 34 and 35 is representative for the light intensity received by the photodiode 38.

In another example the photodiode circuit from FIG. 7 is connected to the detection circuit from FIG. 5. At first the switches S21 and S22 need to both be opened. This may be assured by the second switching means 47. Then the first switching means 46 simultaneously close the switches S1 I, S12 and S13. The current IT generated by the current source 44 may not flow to ground through the photodiode 42. Instead the current IT flows to ground through resistor 43 and through the closed switch S11. The voltage evaluating means 45 now receive a voltage which is equal to the product between the current IT and the value of the resistor 43. After a lapse of time in which the voltage evaluating means 45 will have evaluated the voltage at his input the first switching means 46 simultaneously open switches S11, S12 and S13 and indicate this state to an input of the second switching means 47. Due to an output of the voltage evaluating means 45 the second switching means 47 simultaneously close the switches S21 and S22. The regulating means 48 receive a voltage from the second input 35, this voltage being a reverse biasing voltage. The regulating means 48 regulate the reverse biasing voltage received at its input to a predetermined reverse biasing voltage VB by emitting an appropriate signal to the first input 34. The second output 41 which is at the same voltage as the second input 35 creates at one pole of the photodiode 42 the reverse biasing voltage VB which has a positive value. Any light received by the photodiode 42 results in a current which flows to ground. At the same time a current is emitted by the regulating means 48 which flows through the resistor 43. The voltage at the poles of the resistor 43 may be measured between the first input and the second input 34 and 35 and is proportional to a light intensity received by the photodiode 42.

Figure 8:
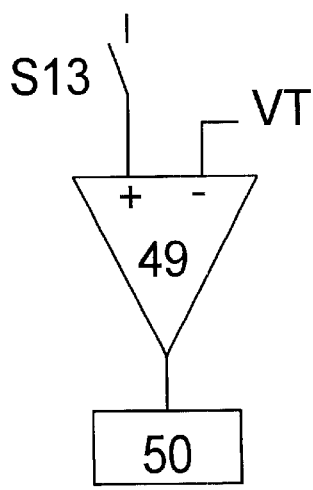

The second switching means 47 may comprise a logic and circuit (not shown). Two conditions normally "switches S11, S12 and S13 open" and "output of voltage evaluating means 45 equals product of current IT by value of resistor 43" are required at its input for the second switching means 47 to close S21 And S22. In FIG. 8 an example for realizing the voltage evaluating means 45 is schematically represented. A comparator 49 receives at one of its inputs a predetermined reference voltage VT and at another input a signal which is dependent on whether the switch S13 is opened or closed. Referring now to the example where the photodiode circuit shown in FIG. 6 is connected to the detection circuit from FIG. 5, VT may be chosen such that it is of greater value then the voltage received through the closed switch S13. On the other hand VT may be also chosen such that when the photodiode circuit from FIG. 7 is connected to the detection circuit it has a value smaller than a value of a voltage resulting from the current IT flowing through the resistor 43. The voltage comparator 49 may store the result of the comparison in a memory device 50 for later use.

Figure 9:
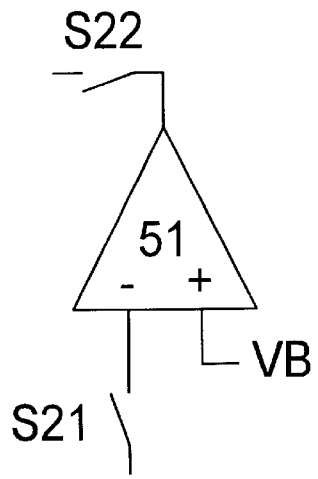

FIG. 9 shows an example of realization for the regulating means 48. A differential amplifier 51 allows to keep a voltage between its output at switch S22 and its input at switch S21 at a predetermined reverse biasing voltage VB, which is applied at another input.

Figure 10:
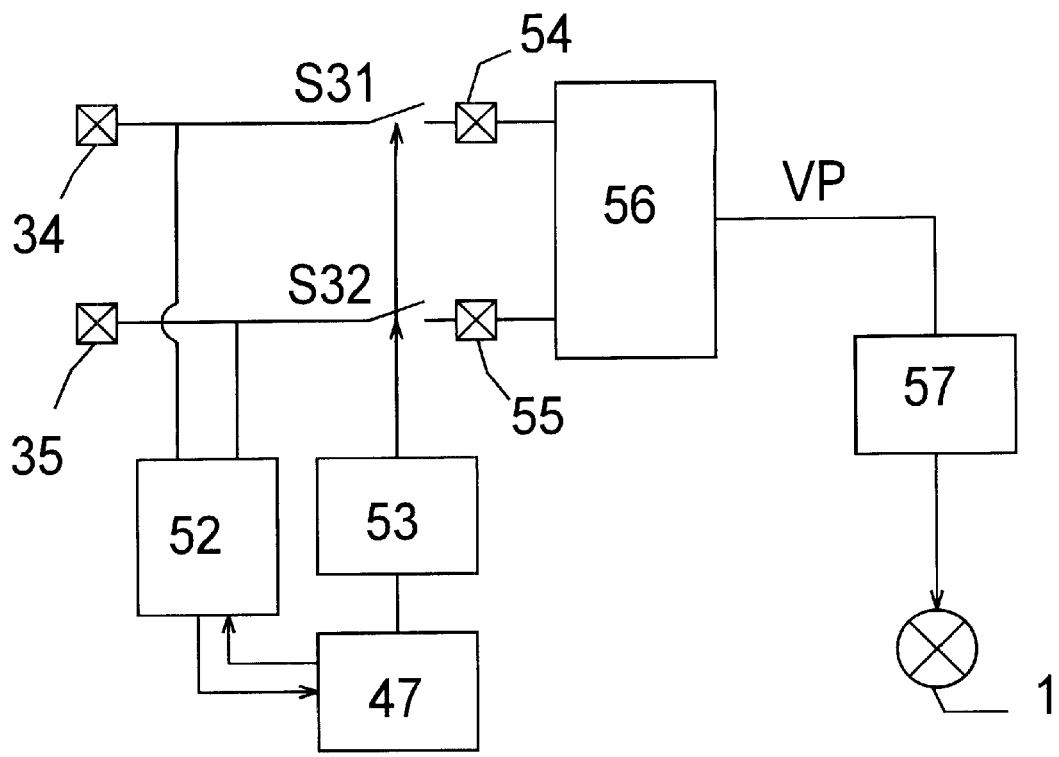

FIG. 10 schematically shows a circuit which allows to monitor a light intensity measured using a photodiode circuit connected at the first and the second input 34 and 35, and to control an intensity emitted by light source 1. A detection circuit 52 and second switching means 47 automatically adapt themselves to a type of photodiode circuit which is connected to the first and second input 34 and 35. The detection circuit 52 and the second switching means 47 may be realized as described above for FIG. 5. The second switching means 47 are connected to third switching means 53 which allow to simultaneously open or close switches S31 and S32.

A voltage between a first and a second electrode 54 and 55 is evaluated by further evaluating means 56 which at an output deliver a photo voltage VP in case the switches S31 and S32 are closed. A value of the photo voltage VP is proportional to a light intensity received by a photodiode of the connected photodiode circuit. The light intensity received provides from the light source 1. The photovoltage is fed to an input of power regulating means 57 an output of which is connected to the light source 1. The power regulating means 57 regulate the intensity of the light source 1 such that the photo voltage VP be kept to a constant value.

Figure 11:
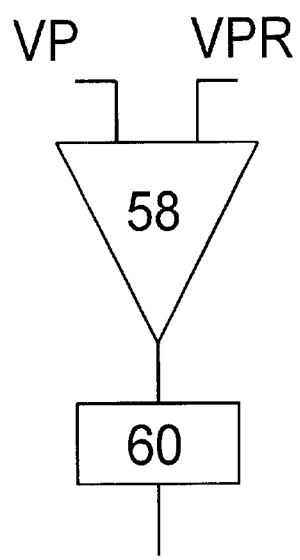

FIG. 11 schematically shows an example of how to realize the power regulating means 57. A comparator 58 compares the photo voltage VP at an input with a predetermined reference photo voltage VPR at another input. A result of this comparison may be used to regulate with a regulator 60 the power fed to the light source 1 in a manner known from a person skilled in the art.

The described examples of a detection circuit and/or of a light intensity monitoring and controlling circuit may be used in an optical disc player and/or recorder (not shown). Typically a semi-conductor laser diode is used as the light source 1. Light emitted by the semi-conductor laser diode is directed to an optical disc to scan information stored on the disc. Light reflected and/or transmitted by the optical disc is received by the photodiode of the photodiode circuit.

A detection circuit according to the present invention may be realized in an integrated circuit. The same is true for a light intensity monitor and controlling circuit. The first and the second input 34 and 35 are pins of the integrated circuit to which the first and the second outputs of the photodiode circuit may e.g. be soldered. The first switching means 46 may be initiated to simultaneously close the switches S11, S12 and S13 by feeding a test enable signal to them. After a lapse of time has passed in which a possible current IT has stabilised a measure enable signal is given to the voltage evaluating means 45 instructing it to evaluate the voltage at its input and store the result of the evaluation in a memory device. While the test enable signal is applied the photodiode of the photodiode circuit should not receive any light, i.e. the light source should be switched off. Once no more test enable signal is applied the first switching means 46 enable the second switching means 47 to close or not to close the switches S21 and S22. At this point the light source 1 may be turned on and light received by the photodiode of the photodiode circuit detected.

Other ways of realizing the inventions and variations of the described example may well be found by a person skilled in the art while remaining in the scope of the claimed invention.

What is claimed is:

1. Method for automatically configuring a photodiode device having one of forward bias or reverse bias, and delivering between first and second electrodes of the photo diode device a photovoltage of a predetermined polarity, depending on a bias of a photodiode circuit used in the photodiode device, the photodiode circuit having first and second output terminals, the method comprising the steps of:

connecting said first output terminal to ground, connecting to said second output terminal a current source of a predetermined current value, comparing a voltage at said second output terminal with a predetermined reference voltage, emitting a signal indicating the bias of the photodiode circuit, storing said signal, disconnecting said first output terminal from ground and said second output terminal from said current source, connecting said first and said second output terminals to said first and second electrodes respectively, maintaining said second output terminal at a constant reverse biasing voltage if said stored signal identifies a first type of bias by comparing a biasing voltage value at said second output terminal with a reference biasing voltage value and applying a variable current to said first output terminal in response to the comparison.

2. Method for controlling an intensity of a light source comprising the steps of:

connecting a photodiode circuit having one of a first and second type of bias to a test circuit, determining at least whether said photodiode circuit has said second type of bias, storing a positive result if said determining reveals said photodiode circuit has said second type of bias, disconnecting said test circuit, connecting said photodiode circuit to a detection circuit, adapting said detection circuit for said second type of bias if said stored result is positive, or else for said first type of bias.

receiving on at least a photodiode of said photodiode circuit light emitted by said light source, obtaining at an output terminal of said detection circuit a photovoltage of a predetermined polarity, regulating an intensity of said light source such to maintain said photovoltage at a reference photovoltage value.

3. Automatically adapting forward or reverse biased photodiode detection circuit, the circuit comprising: a first input terminal and a second input terminal for connecting a photodiode circuit, said first input terminal being connected to ground over a first switch, said second input terminal being connected over a second switch to a current source and over a third switch to voltage evaluation means; first switching means for simultaneously opening or closing said first, second and third switches; regulating means having an input terminal connected over a fourth switch to said second input terminal and an output terminal connected over a fifth switch to said first input terminal to regulate a biasing voltage at said second input terminal to a predetermined reverse biasing voltage; and second switching means for simultaneously opening or closing said fourth and fifth switches and being connected to an output terminal of said voltage evaluating means and to said first switching means.

4. Photodiode detection circuit according to claim 3, wherein said voltage evaluating means comprises a voltage source which generates a predetermined reference voltage, a voltage comparator having one input terminal connected to said voltage source, another input terminal connected to said third switch, and a memory device to store a result of a comparison delivered at an output terminal of said voltage comparator.

5. Photodiode detection circuit according to claim 4, wherein said regulating means comprises a further voltage source which generates said predetermined reverse biasing voltage, an amplifier having an input terminal connected to said further voltage source, another input terminal connected to said fourth switch, and an output terminal connected to said fifth switch.

6. Photodiode detection circuit according to claim 5 wherein said second switching means comprises a logic AND circuit.

7. Light intensity monitoring and controlling circuit comprising an automatically adapting forward or reversed biased photodiode detection circuit according to claim 3, and including an additional voltage evaluating means to determine a photovoltage value of a voltage between said first and said second input terminals, said additional voltage evaluating means having a first and a second evaluating input terminal connected to said first and said second input terminals through a sixth and a seventh switch respectively, said photovoltage value being emitted at an evaluating output terminal, third switching means which allow to simultaneously open or close said sixth and said seventh switch and an input terminal which is connected to said second switching means, power regulating means which allow to regulate an intensity of a light source as a function of said photovoltage value, said power regulating means being connected to said evaluating output.

8. Light intensity monitoring and controlling circuit according to claim 7, in which said power regulating means comprise a reference photovoltage source which generates a predetermined reference photovoltage, photovoltage comparing means to compare said predetermined reference photovoltage with said photovoltage, a result of the photovoltage comparing being used to regulate said intensity.

9. Optical disk player and/or recorder comprising a light intensity monitoring and controlling circuit according to claim 8 in which said light source is a semi-conductor laser diode, an optical disk is read and/or recorded using light emitted by said laser diode and at least one photodiode comprised in said photodiode circuit receives light reflected or transmitted by said optical disk during a reading and/or recording on the same.

* * * * *